United States Patent
Cho et al.

(10) Patent No.: US 8,374,294 B2
(45) Date of Patent: Feb. 12, 2013

(54) APPARATUS AND METHOD FOR AUTOMATIC GAIN CONTROL

(75) Inventors: Chun Ming Cho, Keelung (TW); Liang Hui Lee, Tainan (TW)

(73) Assignee: Realtek Semiconductor Corp., Hsinchu (TW)

( * ) Notice: Subject to any disclaimer, the term of this patent is extended or adjusted under 35 U.S.C. 154(b) by 834 days.

(21) Appl. No.: 11/778,631

(22) Filed: Jul. 16, 2007

(65) Prior Publication Data

US 2008/0013655 A1    Jan. 17, 2008

(30) Foreign Application Priority Data

Jul. 17, 2006    (TW) .............................. 95125991 A

(51) Int. Cl.
*H04L 27/08* (2006.01)
(52) U.S. Cl. ......... 375/345; 330/129; 330/254; 375/316
(58) Field of Classification Search .................... 375/345
See application file for complete search history.

(56) References Cited

U.S. PATENT DOCUMENTS

| | | | | |
|---|---|---|---|---|
| 5,642,075 | A * | 6/1997 | Bell | 330/129 |
| 6,163,210 | A * | 12/2000 | Fukuchi | 330/52 |
| 6,204,651 | B1 * | 3/2001 | Marcus et al. | 323/283 |
| 6,229,397 | B1 * | 5/2001 | Miura | 330/289 |
| 6,721,547 | B2 | 4/2004 | Husted et al. | |
| 6,804,501 | B1 | 10/2004 | Bradley et al. | |
| 7,239,856 | B2 | 7/2007 | Ahn et al. | |
| 7,626,616 | B2 | 12/2009 | Kokubo et al. | |
| 2001/0044287 | A1 * | 11/2001 | Iwata et al. | 455/245.1 |
| 2002/0054583 | A1 | 5/2002 | Olesen et al. | |
| 2004/0022004 | A1 * | 2/2004 | Habuka et al. | 361/119 |
| 2004/0242172 | A1 * | 12/2004 | Haim et al. | 455/127.2 |
| 2004/0264608 | A1 * | 12/2004 | Habuka et al. | 375/345 |
| 2005/0003784 | A1 * | 1/2005 | Inamori et al. | 455/249.1 |
| 2005/0057485 | A1 * | 3/2005 | Diefenbaugh | 345/102 |
| 2005/0243938 | A1 * | 11/2005 | Armstrong et al. | 375/260 |
| 2007/0232250 | A1 * | 10/2007 | Sun et al. | 455/127.1 |
| 2007/0237264 | A1 * | 10/2007 | Huang et al. | 375/332 |
| 2007/0280079 | A1 * | 12/2007 | Cheng et al. | 369/59.1 |
| 2008/0013654 | A1 * | 1/2008 | Rick et al. | 375/345 |
| 2008/0018508 | A1 * | 1/2008 | Filipovic et al. | 341/118 |
| 2008/0278212 | A1 * | 11/2008 | Chang et al. | 327/307 |

FOREIGN PATENT DOCUMENTS

| | | |
|---|---|---|
| CN | 1475056 | 2/2004 |
| CN | 1527522 A | 9/2004 |
| CN | 1706112 | 12/2005 |
| CN | 1922867 | 2/2007 |

OTHER PUBLICATIONS

English translation of abstract of CN1527522A. Chinese language publication date Sep. 8, 2004, English translation date unknown.

* cited by examiner

*Primary Examiner* — Erin File
(74) *Attorney, Agent, or Firm* — McClure, Qualey & Rodack, LLP

(57) ABSTRACT

An apparatus and an associated method for automatic gain control (AGC) are provided to improve the ability to lock effective signal power when interference exists, thereby upgrading the receiver performance of a communication system. The apparatus includes a variable-gain circuit for adjusting the power level of an input signal. The apparatus also includes a gain adjustment circuit and a target value adjustment circuit. The gain adjustment circuit is for adjusting the gain of the variable-gain circuit according to the adjusted input signal and a target value, while the target value adjustment is for dynamically adjusting the target value according to the strength of the adjusted input signal.

16 Claims, 3 Drawing Sheets

APPARATUS AND METHOD FOR AUTOMATIC GAIN CONTROL

BACKGROUND OF THE INVENTION (a). Field of the Invention

This invention relates to a communication system, and more particularly, to an apparatus and method for automatic gain control for the communication system.

(b). Description of the Prior Arts

In general, a receiver in the communication field needs to fix a received signal at a specific power level. Such mechanism is called automatic gain control (AGC). In prior art, a receiver first detects the signal power received and compares it with a threshold level to generate a comparison signal, and then feeds the comparison signal back to a front-end programmable-gain amplifier (PGA) or a variable-gain amplifier (VGA) to adjust the received signal power. In this manner, the receiver, within a reasonable received power range, can lock the received signal power at a desired level.

However, since the prior art determines how to adjust the signal power according to the comparison of total power of the received signal with the threshold level, the received power level will be deviated when the received signal is mixed with undesired interference. Thus, more quantization noise might be generated during the analog-to-digital signal conversion to degrade the receiver performance.

Other conventional technologies use an additional interference detector to reduce the interference effect. However, the additional circuit means a higher cost, and the interference detector might not work if there is undetectable interference.

SUMMARY OF THE INVENTION

It is therefore one objective of the present invention to provide an automatic gain control (AGC) apparatus and a control method thereof to deal with the aforesaid problem.

Another objective of the present invention is to provide an AGC apparatus and a control method thereof that can improve the ability of AGC to lock the effective signal power in the presence of interference, thereby enhancing the receiver performance of the communication system.

In one embodiment of the invention, an apparatus for amplifying an input signal and outputting an output signal comprises: a variable-gain circuit to amplify the input signal and to output the output signal according to a gain of the variable-gain circuit, wherein the gain of the variable-gain circuit is adjusted according to an adjustment signal; a gain adjustment circuit, coupled to the variable-gain circuit, to generate the adjustment signal according to the output signal and a target value; and a target value adjustment circuit, coupled to the gain adjustment circuit, to monitor a strength of the output signal to generate a control signal, and generate the target value according to the control signal.

In another embodiment of the invention, a method for amplifying an input signal and outputting an amplified signal comprises: adjusting a gain according to an adjustment signal; amplifying the input signal to output the amplified signal according to the gain; outputting the adjustment signal according to the amplified signal and a target value; and adjusting the target value according to a strength of the amplified signal.

In another embodiment of the invention, a method for amplifying an input signal and outputting an amplified signal comprises: amplifying the input signal according to a gain to generate the amplified signal; monitoring a strength of the amplified signal to generate a control signal; selecting one of a plurality of target values according to the control signal to output a selected target value; generating a gain adjustment signal according to the amplified signal and the selected target value; and adjusting the gain according to the gain adjustment signal. Preferably, the step of monitoring comprises sampling the amplified signal to output a sampled signal, and determining a saturation status of the sampled signal to generate the control signal.

The features and advantages of the present invention will be more readily understood and apparent from the following detailed description of the invention, which should read in conjunction with the accompanying drawing and from the claims which are appended to the end of the detailed description.

DETAILED DESCRIPTION OF THE INVENTION

Figure 1:
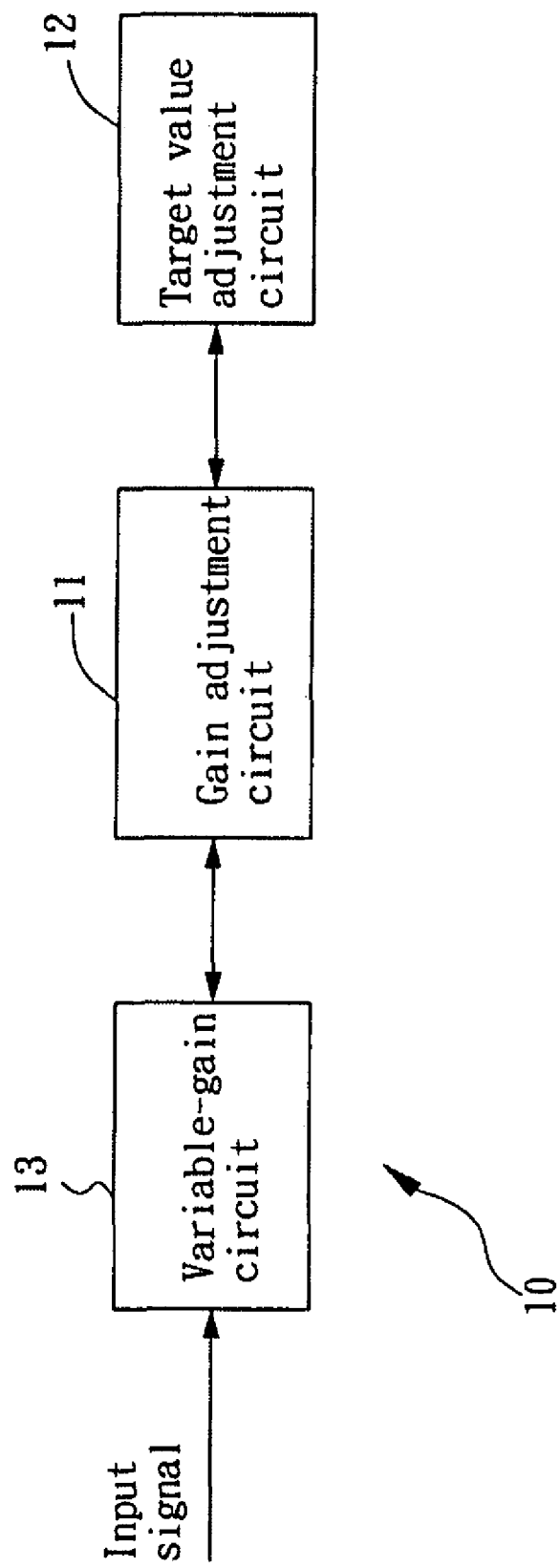
FIG. 1 is a block diagram of an AGC apparatus according to a preferred embodiment of the invention.

FIG. 1 is a block diagram of an AGC apparatus according to a preferred embodiment of the invention. As shown in FIG. 1, the AGC apparatus 10 comprises a variable-gain circuit 13, a gain adjustment circuit 11 and a target value adjustment circuit 12, and is used in a receiver of a communication system. The variable-gain circuit 13 amplifies an input signal according to a gain of the variable-gain circuit 13 and then outputs an amplified signal. The gain adjustment circuit 11 is coupled to the variable-gain circuit 13 and adjusts the gain of the variable-gain circuit 13 according to the amplified signal and a target value. The target value adjustment circuit 12 monitors a strength of the amplified signal to generate a control signal, and generates the target value according to the control signal.

Figure 2:
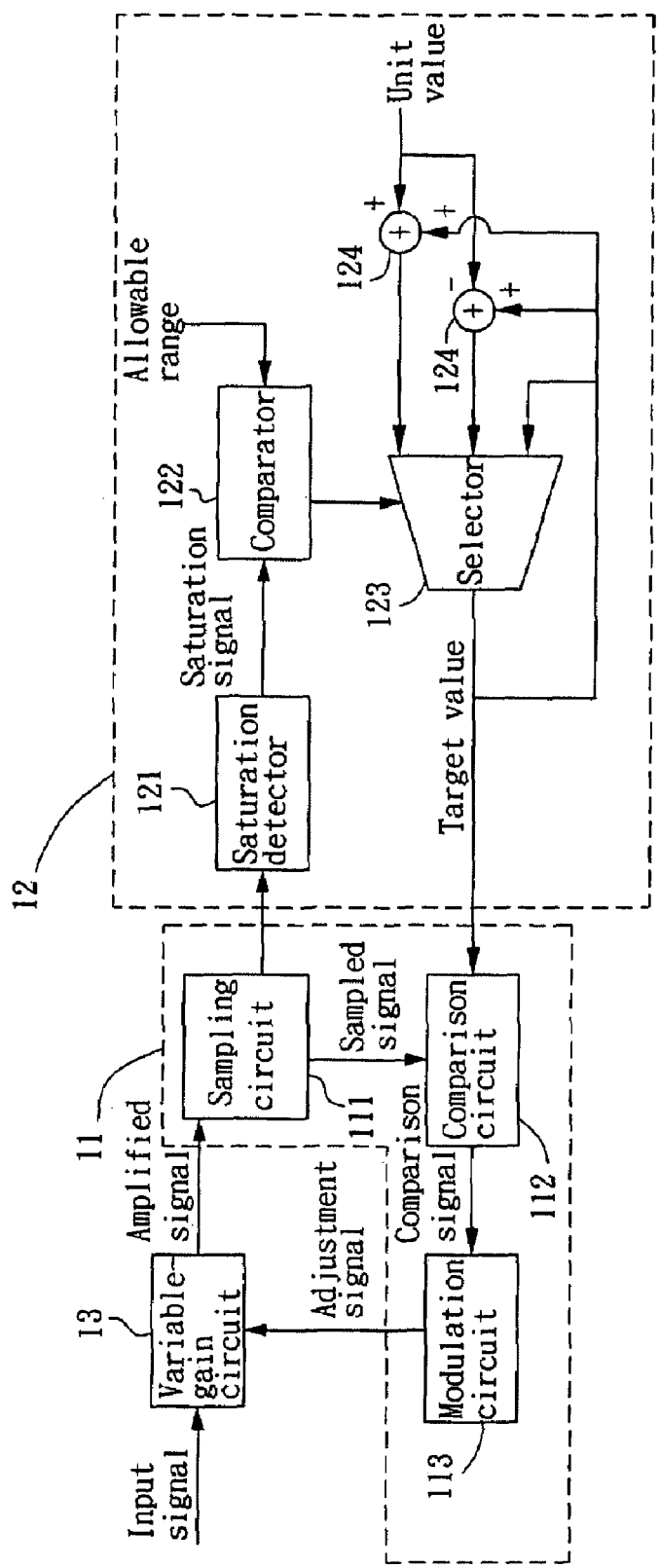
FIG. 2 is a detailed diagram of the AGC apparatus in FIG. 1.

FIG. 2 is a detailed diagram of the AGC apparatus 10 in FIG. 1. As shown in FIG. 2, the gain adjustment circuit 11 comprises a sampling circuit 111, a comparison circuit 112 and a modulation circuit 113. The sampling circuit 111 receives the amplified signal from the variable-gain circuit 13 and samples the amplified signal to output a sampled signal. In an embodiment, the sampling circuit 111 is an analog-to-digital converter.

The comparison circuit 112 receives the sampled signal and the target value from the sampling circuit 111 and the target value adjustment circuit 12 respectively, and compares the power (or amplitude) of the sampled signal with the target value so as to output a comparison signal (also called error signal). In an embodiment, the comparison circuit 112 includes a moving average calculator or an integrator to generate the comparison signal according to the difference between the power (or amplitude) of the sampled signal and the target value.

The modulation circuit 113 generates an adjustment signal to the variable-gain circuit 13 according to the comparison signal, thereby adjusting the gain of the variable-gain circuit 13. The modulation circuit 113 executes a pulse width modulation (PWM) or delta-sigma modulation to convert the comparison signal into an analog adjustment signal for output. In an embodiment, the modulation circuit 113 sends the analog adjustment signal to the variable-gain circuit 13 via a low-pass filter (not shown in the figure).

The target value adjustment circuit 12 includes a saturation detector 121, a comparator 122 and a selector 123. The saturation detector 121, coupled to the sampling circuit 111, monitors a saturation status of the sampled signal to generate a saturation signal, e.g. detects whether the sampling circuit 111 is saturated due to the amplified signal exceeding its input range. The saturation status of the sampled signal can be represented by a saturation probability, which measures the number of times the sampling circuit 111 becomes saturated within a fixed time period and is provided to the comparator 122 by the saturation signal. For example, if the saturation occurs ten times in every $10^5$ points of the sampled signal output by the sampling circuit 111, the saturation probability is $10^{-4}$. A too high saturation probability means the gain of the variable-gain circuit 13 is too high. As described above, the gain is adjusted based on the comparison result (i.e. the comparison signal) of the sampled signal power and the target value. Thus, the too high gain means the current target value is also too high. On the other hand, a too low saturation probability means that both the current target value and the power entering the sampling circuit 111 are too low. This will result in a low signal-to-noise ratio (SNR) of effective signal to quantization noise and thus poor receiver performance. Since the too high or too low saturation probability will degrade the receiver performance, an allowable range for saturation probability can be set and the target value will be dynamically adjusted as described below when the saturation probability does not fall within the allowable range.

The comparator 122 compares the saturation probability (provided by the saturation signal output by the saturation detector 121) with the allowable range, and outputs a corresponding control signal. The selector 123 (which can be a multiplexer), according to the control signal, selects one of the three values below as a new target value for output: the current target value, the sum of the current target value and an unit value, and the difference between the current target value and the unit value. The target value adjustment circuit 12 also includes two adders 124 to respectively generate the sum of the current target value and the unit value as well as the difference between the current target value and the unit value. The allowable range and the unit value can be determined and adjusted according to the characteristics of the communication system.

If the saturation probability lies within the allowable range, the selector 123 will select the current target value for output to keep the target value unchanged. If the saturation probability is less than the allowable range (i.e. less than the lower limit of the allowable range), it means the power of the gain signal is too small, which results in the low saturation probability of the sampling circuit 111. Thus, the selector 123 will select the sum of the current target value and the unit value (i.e. incrementing the current target value by a unit value) as the new target value. This new target value will be sent to the comparison circuit 112 to generate a smaller comparison signal, which will increase the gain of the variable-gain circuit 13. In this manner, the saturation probability of the sampling circuit 111 will also be increased.

In contrast, if the saturation probability is greater than the allowable range (i.e. greater than the upper limit of the allowable range), it means the power of the gain signal is too big, which results in the high saturation probability of the sampling circuit 111. Thus, the selector 123 will select the difference between the current target value and the unit value (i.e. decrementing the current target value by a unit value) as the new target value. This new target value will make the comparison circuit 112 generate a greater comparison signal, which will reduce the gain of the variable-gain circuit 13. In this manner, the saturation probability of the sampling circuit 111 will also be decreased. By dynamically adjusting the target value as described above, the gain of the variable-gain circuit 13 (and the saturation probability of the sampling circuit 111) can be controlled within the desired range.

In an embodiment, the effective signal of the communication system has a higher peak-to-average power ratio (PAPR) as in an orthogonal frequency division multiplexing (OFDM) system. When the PAPR of the effective signal is high, the interference has little influence on the PAPR of the input signal (including the effective signal and interference). Since the PAPR of the input signal is directly associated with the saturation probability of the sampling circuit 111, the saturation probability will be just slightly affected by the interference in the input signal in this embodiment. Thus, an optimum target value can be obtained according to the magnitude of the saturation probability.

Figure 3:
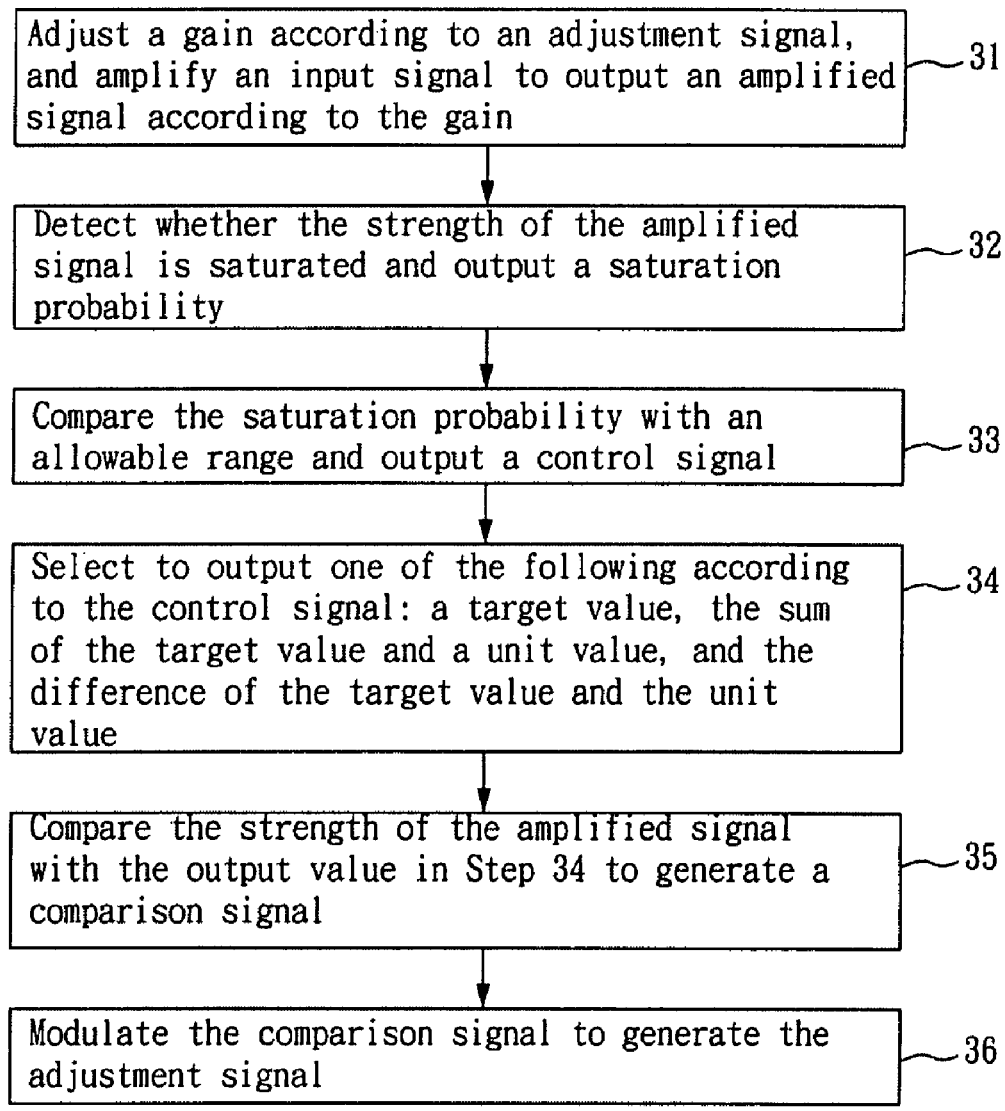
FIG. 3 shows a flow chart of an AGC method according to a preferred embodiment of the invention.

FIG. 3 shows a flow chart of an AGC method according to a preferred embodiment of the invention, which includes the following steps:

Step 31: Adjust a gain according to an adjustment signal, and amplify an input signal to output an amplified signal according to the gain;

Step 32: Detect whether the strength of the amplified signal is saturated and output a saturation probability;

Step 33: Compare the saturation probability with an allowable range and output a control signal;

Step 34: Select to output one of the following according to the control signal: a target value, the sum of the target value and a unit value, and the difference of the target value and the unit value;

Step 35: Compare the strength of the amplified signal with the output value in Step 34 to generate a comparison signal; and Step 36: Modulate the comparison signal to generate the adjustment signal.

In Steps 33 and 34, if the saturation probability lies within the allowable range, the target value will be output; if the saturation probability is smaller than the allowable range, the sum of the target value and the unit value will be output; if the saturation probability is greater than the allowable range, the difference of the target value and the unit value will be output.

While the present invention has been shown and described with reference to the preferred embodiments thereof and in terms of the illustrative drawings, it should not be considered as limited thereby. Various possible modifications and alterations could be conceived of by one skilled in the art to the form and the content of any particular embodiment, without departing from the scope and the spirit of the present invention.

What is claimed is:

1. An apparatus for amplifying an input signal and outputting an output signal, comprising:
    a variable-gain circuit to amplify the input signal and to output the output signal according to a gain of the variable-gain circuit, wherein the gain of the variable-gain circuit is adjusted according to an adjustment signal;
    a gain adjustment circuit, coupled to the variable-gain circuit, to generate the adjustment signal according to the output signal and a target value; and
    a target value adjustment circuit, coupled to the gain adjustment circuit, to monitor a strength of the output signal to generate a control signal, and generate the target value according to the control signal, wherein the target value adjustment circuit further comprises a selector configured to select a current target value as a new target value if a saturation probability of the input signal lies within an allowable range, wherein the selector is configured to select a sum of the current target value and a unit value as the new target value if the saturation probability is less than the allowable range.

2. The apparatus of claim 1, wherein the gain adjustment circuit further comprises:
a sampling circuit to sample the output signal to output a sampled signal; and
a comparison circuit to output a comparison signal according to the sampled signal and the target value, wherein the adjustment signal corresponds to the comparison signal.

3. The apparatus of claim 2, wherein the comparison circuit comprises a moving average calculator.

4. The apparatus of claim 2, wherein the comparison circuit comprises an integrator.

5. The apparatus of claim 2, wherein the gain adjustment circuit further comprises:
a pulse width modulation (PWM) circuit for generating the adjustment signal according to the comparison signal.

6. The apparatus of claim 2, wherein the gain adjustment circuit further comprises:
a delta-sigma modulation circuit for generating the adjustment signal according to the comparison signal.

7. The apparatus of claim 2, wherein the target value adjustment circuit adjusts the target value according to a saturation status of the sampled signal from the sampling circuit.

8. The apparatus of claim 7, wherein the target value adjustment circuit comprises:
a detector to monitor the saturation status of the sampled signal to generate a saturation signal;
wherein the target value adjustment circuit adjusts the target value according to the saturation signal.

9. A method for amplifying an input signal and outputting an amplified signal in a communication system, comprising:
adjusting a gain according to an adjustment signal;
amplifying the input signal to output the amplified signal according to the gain;
outputting the adjustment signal according to the amplified signal and a target value;
detecting whether the strength of the amplified signal is saturated, and outputting a saturation probability; and
adjusting the target value according to the saturation probability by selecting one of a plurality of values as the target value, wherein the plurality of values comprises: the target value, a sum of the target value and a unit value, and a difference of the target value and the unit value.

10. The method of claim 9, wherein the communication system is an orthogonal frequency division multiplexing (OFDM) system.

11. The method of claim 9, wherein the step of outputting the adjustment signal comprises:
comparing a strength of the amplified signal with the target value to generate a comparison signal; and
outputting the adjustment signal according to the comparison signal.

12. The method of claim 11, wherein the comparison signal is performed a pulse width modulation (PWM) to generate the adjustment signal.

13. The method of claim 11, wherein the comparison signal is performed a delta-sigma modulation to generate the adjustment signal.

14. The method of claim 9, wherein the saturation probability represents a number of times the amplified signal is saturated within a fixed time period.

15. The method of claim 9, wherein the target value is adjusted when the saturation probability falls outside an allowable range.

16. A method for amplifying an input signal and outputting an amplified signal, comprising:
amplifying the input signal according to a gain to generate the amplified signal; monitoring a strength of the amplified signal to generate a control signal; selecting one of a plurality of target values according to the control signal to output a selected target value, wherein the plurality of target values comprises a current target value and a variation of the current target value by a unit value;
generating a gain adjustment signal according to the amplified signal and the selected target value; and
adjusting the gain according to the gain adjustment signal, wherein the step of monitoring comprises: sampling the amplified signal to output a sampled signal; and determining a saturation status of the sampled signal to generate the control signal.

* * * * *